(12) United States Patent
Meacham et al.

(10) Patent No.: US 7,015,749 B1
(45) Date of Patent: Mar. 21, 2006

(54) FREQUENCY DISCRIMINATOR USING REPLICA COMPENSATED DELAY LINES AND METHOD OF OPERATION

(75) Inventors: Daniel R. Meacham, La Jolla, CA (US); Ibrahim Yayla, Encinitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 261 days.

(21) Appl. No.: 10/071,348

(22) Filed: Feb. 8, 2002

Related U.S. Application Data

(60) Provisional application No. 60/267,364, filed on Feb. 8, 2001.

(51) Int. Cl.
*H03D 3/00* (2006.01)
(52) U.S. Cl. ...................................... 329/303; 375/303
(58) Field of Classification Search ................ 329/300, 329/303; 331/57; 375/303
See application file for complete search history.

(56) References Cited

U.S. PATENT DOCUMENTS

| | | | | |
|---|---|---|---|---|
| 4,433,422 A | * | 2/1984 | Kurth .......................... | 375/226 |
| 4,485,448 A | * | 11/1984 | Kurth .......................... | 702/70 |
| 5,319,679 A | * | 6/1994 | Bagby ......................... | 375/354 |
| 5,420,888 A | * | 5/1995 | Davis et al. .................. | 375/334 |
| 5,436,938 A | * | 7/1995 | Pigeon ........................ | 375/376 |
| 5,818,296 A | * | 10/1998 | Lee et al. .................... | 329/300 |
| 5,926,052 A | * | 7/1999 | Dow et al. ................... | 327/234 |
| 6,295,328 B1 | * | 9/2001 | Kim et al. ................... | 375/376 |
| 6,396,888 B1 | * | 5/2002 | Notani et al. ................ | 375/364 |
| 6,525,585 B1 | * | 2/2003 | Iida et al. .................... | 327/279 |

* cited by examiner

*Primary Examiner*—Timothy P. Callahan
*Assistant Examiner*—Cassandra Cox

(57) ABSTRACT

A frequency discriminator for detecting phase shifts between sequential pulses in a frequency-shift keyed (FSK) signal having a nominal frequency, f. The frequency discriminator comprises: 1) a first current controlled delay line for receiving the FSK signal and delaying the FSK signal by a desired time delay to thereby produce a time-delayed FSK signal; 2) a multiplier for receiving and multiplying the FSK signal and the time-delayed FSK signal to thereby produce an output product signal proportional to a phase shift between said FSK signal and said time-delayed FSK signal; and 3) a delay locked loop comprising a second current controlled delay line substantially similar to the first current controlled delay line. The delay locked loop receives a reference clock signal having a time period equal to the desired time delay and adjusts a control current level in the second current controlled delay line until a delay of the second current controlled delay line matches the time period of the reference clock signal. The control current level is then used to adjust a delay of the first current controlled delay line.

24 Claims, 3 Drawing Sheets

FREQUENCY DISCRIMINATOR USING REPLICA COMPENSATED DELAY LINES AND METHOD OF OPERATION

The present application claims priority as a non-provisional counterpart application to U.S. provisional application Ser. No. 60/267,364 entitled FREQUENCY DISCRIMINATOR APPARATUS and filed Feb. 8, 2001. The content of the above-identified application(s) is incorporated herein by reference.

TECHNICAL FIELD OF THE INVENTION

The present invention is directed, in general, to radio frequency (RF) receivers and, more specifically, to a frequency discriminator that uses replica compensated delay lines to accurately control delays.

BACKGROUND OF THE INVENTION

The frequency spectrum of a digital radio system is broken into channels that are small sub-spectrums. A first transmitter and receiver pair establishes a communication link over a first predetermined channel while other transmitter and receiver pairs use other predetermined channels. The transmitter transmits to the receiver over the channel using a predetermined data rate and modulation scheme, such as binary phase shift keying (BPSK), quadrature phase shift keying (QPSK), binary frequency shift keying (BFSK), or quadrature frequency shift keying (QFSK).

Typically, a data transmission consists of three parts. The first part is an unmodulated carrier signal. The second part is a preamble of known information that is relatively easy for the receiver to detect and to synchronize with. The preamble may be, for example, a period of carrier signal modulated by a known training sequence (e.g., square wave) using a simple modulation scheme (i.e., BPSK). The third part of the data transmission is the modulated waveform that contains the unknown information data bits that are being transmitted.

The data rate of the transmission is usually measured in bits per second (bps), including kilobits per second (Kbps) and megabits per second (Mbps). The number of bits per second is related to the type of signaling (also known as encoding and modulation) that is used to convey the information and the number of times per second that the transmitted signal changes its value. For example, in a phase shift keyed (PSK) digital signal radio system, data is encoded by generating phase shift deviations away from the carrier signal. Decoding the transmitted information entails measuring the phase shift deviations away from the carrier signal and inferring the transmitted information. In a frequency shift keyed (FSK) digital signal radio system, data is encoded by generating frequency shift deviations away from the frequency of a carrier signal. Decoding the transmitted information entails measuring the frequency shift deviations away from the carrier signal frequency and inferring the transmitted information.

A frequency discriminator is a well-known circuit that is used in various applications where the information is coded in the frequency change of a signal (e.g., FSK or PSK). FIG. 2 illustrates conventional frequency discriminator 200 according to an exemplary embodiment of the prior art. Frequency discriminator 200 comprises an in-phase (I) processing path and a quadrature (Q) processing path. The in-phase processing path comprises peak-to-peak limiter 205A, delay line 210A, and multiplier 215A, which may be for example, an exclusive-OR (X-OR) gate. The quadrature processing path comprises peak-to-peak limiter 205B, delay line 210B, and multiplier 215B, which may be for example, an exclusive-OR (X-OR) gate. Frequency discriminator 200 further comprises summer 220, low-pass filter (LPF) 225, and analog-to-digital converter (ADC) 230. Summer 220, LPF 225, and ADC 230 are not required for operation of the invention, but are part of one advantageous embodiment of the present invention.

In the in-phase processing path, peak-to-peak limiter 205A is an amplitude limiter used to remove any parasitic amplitude modulation information on the I input signal to frequency discriminator 200. The output of peak-to-peak limiter 205A is essentially a series of pulses (e.g., a square wave) where the pulse width varies according to the amount of phase shift (i.e., frequency change) between pulses. Multiplier 215A mixes the output of peak-to-peak limiter 205A with a delayed version of itself generated by delay line 210A, thereby creating a DC voltage component at its output proportional to the frequency deviation (phase deviation) in the input I signal.

The quadrature processing path operates similarly to the in-phase processing path. Peak-to-peak limiter 205B is an amplitude limiter used to remove any parasitic amplitude modulation information on the Q input signal to frequency discriminator 200. The output of peak-to-peak limiter 205B is essentially a series of pulses (e.g., a square wave) where the pulse width varies according to the amount of phase shift between pulses. Multiplier 215B mixes the output of peak-to-peak limiter 205B with a delayed version of itself generated by delay line 210B, thereby creating a voltage component at its output proportional to the frequency deviation (phase deviation) in the input Q signal.

The outputs of the in-phase processing path quadrature processing path are then added by summer 220. The output of summer 220 is nominally a series of positive and negative pulses having varying duty-cycles. LPF 225 operates as an integrator that recovers the DC component of the output of summer 220. The output of LPF 225 is then converted to digital samples by ADC 230.

The conventional way of delaying the signal is to use a tank circuit. FIG. 3 illustrates conventional delay line 210 using a tank circuit made of discrete components according to an exemplary embodiment of the prior art. Delay line 210 comprises two capacitors, C1 and C2, and an inductor, L1. However, in this scheme, there are a number of problems, including:

1) When the signal frequency is low, the component values become large and are therefore difficult to integrate on a single integrated circuit chip. Using external discrete components requires that two extra chip pins (IN and OUT) be added; and
2) Tracking process variations, as well as supply voltage fluctuations and temperature, is difficult and inaccurate.

Another common prior art method performs the discriminator function in the digital domain. A digital discriminator has the advantage of extremely accurate timing (e.g., the delay is N times the clock period), but suffers from time quantization problems, which lead to phase quantization problems. As a result, the minimum detectable phase shift is equal to one clock cycle of the sampling clock. This typically leads to an extremely high clock rate, higher power, and the requirement of generating a clock at a much higher frequency than is typically required for the rest of the chip.

Therefore, there is a need in the art for improved frequency shift keyed (FSK) receivers and phase shift keyed (PSK) receivers that are capable of more accurately detecting frequency (or phase shifts) in the incoming signal. In particular, there is a need for an improved frequency discriminator for use in FSK and PSK receivers. More particularly, there is a need for an improved frequency discriminator that does not rely on delay lines made from discrete components.

SUMMARY OF THE INVENTION

A novel scheme is proposed to be used in a frequency discriminator to realize controllable and traceable delays on a single integrated circuit (IC) chip.

The limitations inherent in the prior art described above are overcome by the present invention which provides a frequency discriminator for detecting phase shifts between sequential pulses in a frequency-shift keyed (FSK) signal having a nominal frequency, f. According to an advantageous embodiment of the present invention, the frequency discriminator comprises: 1) a first current controlled delay line capable of receiving the FSK signal and delaying the FSK signal by a desired time delay to thereby produce a time-delayed FSK signal; 2) a multiplier capable of receiving and multiplying the FSK signal and the time-delayed FSK signal to thereby produce an output product signal proportional to the phase shift between the FSK signal and the time-delayed FSK signal; and 3) a delay locked loop comprising a second current controlled delay line substantially similar to the first current controlled delay line. The delay locked loop receives a reference clock signal having a time period equal to the desired time delay and adjusts a control current level in the second current controlled delay line until a delay of the second current controlled delay line matches the time period of the reference clock signal. The control current level is then used to adjust a delay of the first current controlled delay line.

According to one embodiment of the present invention, the delay locked loop adjusts the control current level of the second current controlled delay line by adjusting a bias current in the second current controlled delay line.

According to another embodiment of the present invention, the delay locked loop adjusts the delay of the first current controlled delay line by adjusting a bias current in the first current controlled delay line to match the bias current in the second current controlled delay line.

According to still another embodiment of the present invention, the delay locked loop comprises a phase detector having a first input for receiving the reference clock signal and a second input for receiving an output signal of the second current controlled delay line and generating a correction control signal determined by a phase difference between the reference clock signal and the output signal of the second current controlled delay line.

According to yet another embodiment of the present invention, the second current controlled delay line is configured as an oscillator.

According to a further embodiment of the present invention, the frequency discriminator further comprises: 1) a third current controlled delay line capable of receiving the FSK signal and delaying the FSK signal by a desired time delay to thereby produce a time-delayed FSK signal; and 2) a second multiplier capable of receiving and multiplying the FSK signal and the time-delayed FSK signal to thereby produce an output product signal proportional to a phase shift between the FSK signal and the time-delayed FSK signal, wherein the delay locked loop uses the control current level to adjust a delay of the third current controlled delay line.

According to a still further embodiment of the present invention, the delay locked loop adjusts the delay of the third current controlled delay line by adjusting a bias current in the third current controlled delay line to match the bias current in the second current controlled delay line.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) receiver.

Figure 1:
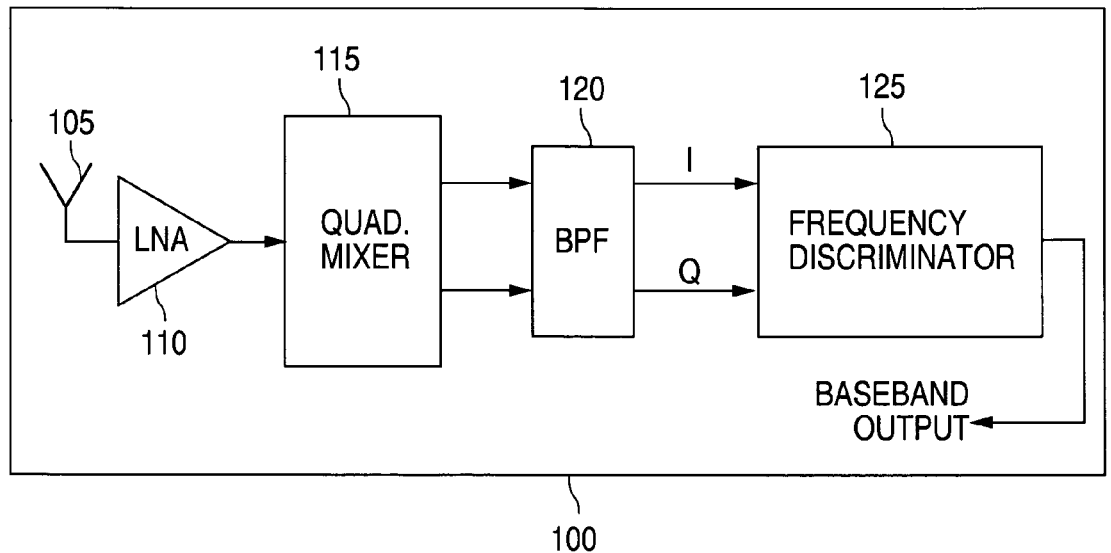
FIG. 1 is a block diagram of a frequency-shift-keyed (FSK) receiver according to an exemplary embodiment of the present invention.
Figure 3:
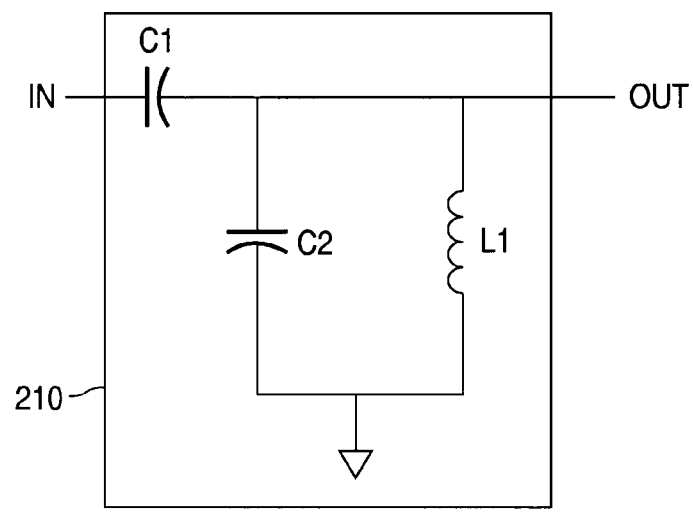
FIG. 3 illustrates a conventional delay line using a tank circuit made of discrete components according to an exemplary embodiment of the prior art.
Figure 2:
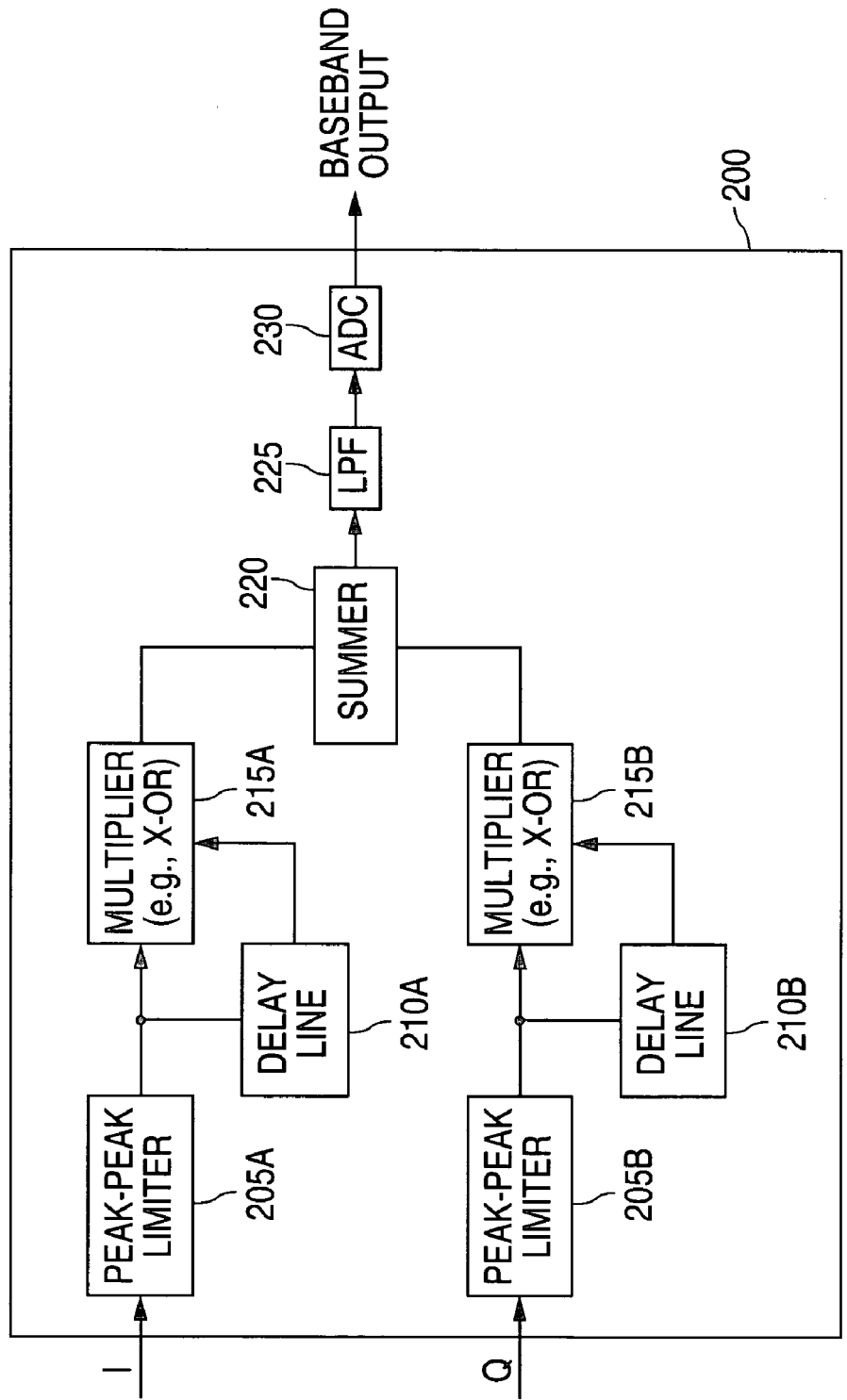
FIG. 2 illustrates a conventional frequency discriminator according to an exemplary embodiment of the prior art.

FIG. 1 is a block diagram of frequency-shift-keyed (FSK) receiver 100 according to an exemplary embodiment of the present invention. FSK receiver 100 comprises antenna 105, low-noise amplifier (LNA) 110, quadrature mixer 115, band-pass filter (BPF) 120, and frequency discriminator 125. LNA 110 amplifies an incoming FSK signal received from antenna 105. The amplified FSK signal is quadrature down-mixed by quadrature mixer 115 to produce an in-phase (I) signal and a quadrature (Q) signal that are filtered by BPF 120 in order to isolate the frequencies of interest. According to an exemplary embodiment of the present invention, BPF 120 may have a center frequency at the data rate (i.e., 1 MHz) and a 3 dB bandwidth equivalent to the data rate (i.e., 500 KHz to 1.5 MHz). The filtered I and Q outputs of BPF 120 are then sent to frequency discriminator 125, which detects and outputs the baseband output signal.

Figure 4:
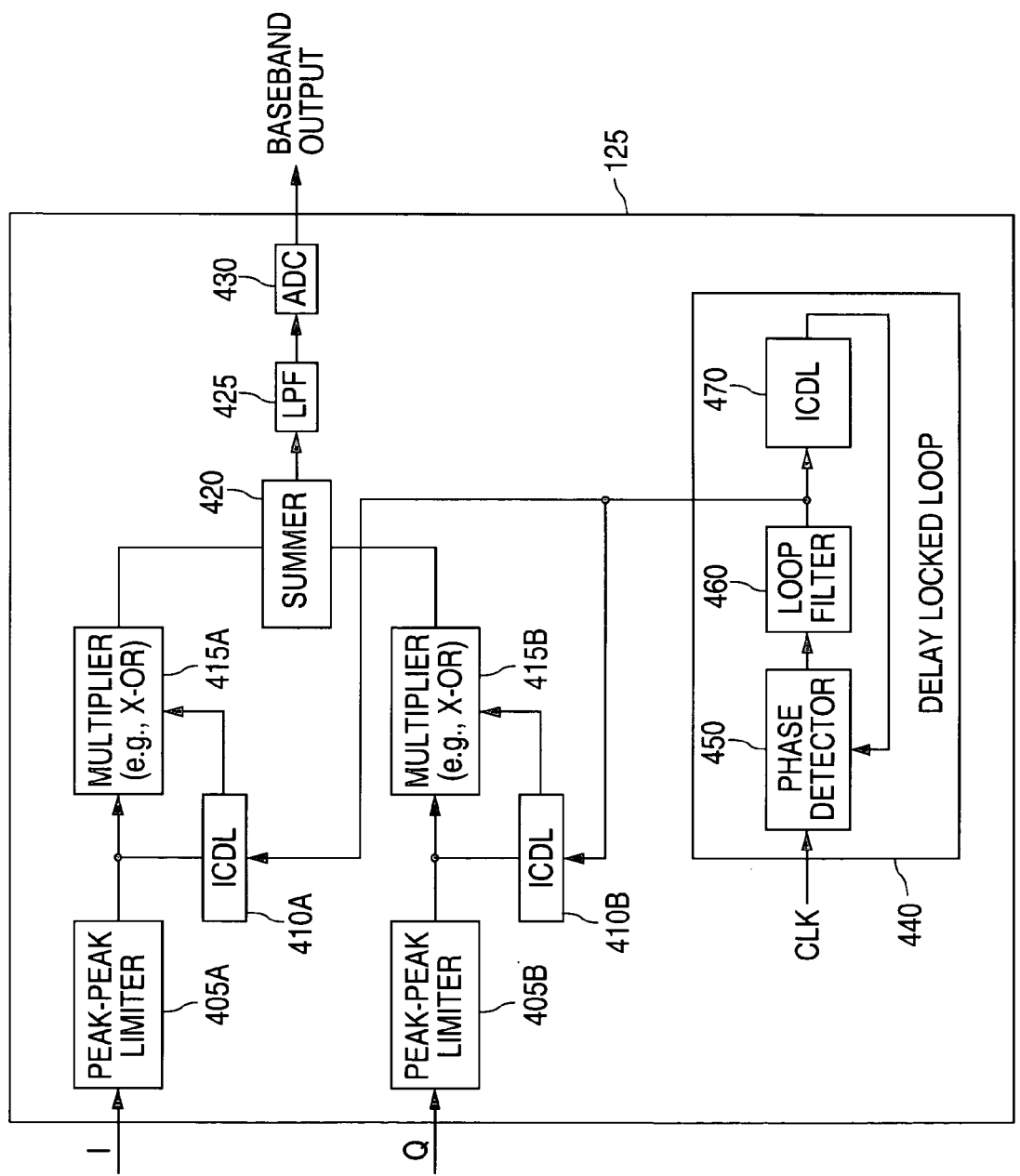
FIG. 4 illustrates a frequency discriminator according to an exemplary embodiment of the present invention.

FIG. 4 illustrates frequency discriminator 125 according to an exemplary embodiment of the present invention. Frequency discriminator 125 comprises an in-phase (I) processing path and a quadrature (Q) processing path. The in-phase processing path comprises peak-to-peak limiter 405A, current controlled delay line (ICDL) 410A, and multiplier 415A, which may be for example, an exclusive-OR (X-OR) gate. The quadrature processing path comprises peak-to-peak limiter 405B, current controlled delay line (ICDL) 410B, and multiplier 415B, which may be for example, an exclusive-OR (X-OR) gate. Frequency discriminator 125 further comprises summer 420, low-pass filter (LPF) 425, analog-to-digital converter (ADC) 430, and delay locked loop 440.

In the in-phase processing path, peak-to-peak limiter 405A is an amplitude limiter used to remove any parasitic amplitude modulation information on the I input signal to frequency discriminator 125. The output of peak-to-peak limiter 405A is essentially a series of pulses (e.g., a square wave) where the pulse width varies according to the amount of phase shift (i.e., frequency change) between pulses. Multiplier 415A mixes the output of peak-to-peak limiter 405A with a delayed version of itself generated by ICDL 410A, thereby creating a DC voltage component at its output proportional to the frequency deviation (phase deviation) in the input I signal.

The quadrature processing path operates similarly to the in-phase processing path. Peak-to-peak limiter 405B is an amplitude limiter used to remove any parasitic amplitude modulation information on the Q input signal to frequency discriminator 125. The output of peak-to-peak limiter 405B is essentially a series of pulses (e.g., a square wave) where the pulse width varies according to the amount of phase shift between pulses. Multiplier 415B mixes the output of peak-to-peak limiter 405B with a delayed version of itself generated by ICDL 410B, thereby creating a voltage component at its output proportional to the frequency deviation (phase deviation) in the input Q signal.

The outputs of the in-phase processing path and quadrature processing path are then added by summer 420. The output of summer 420 is then integrated by LPF 425 to find its DC component. The integrated output of LPF 425 is then converted to digital samples by ADC 430.

Delay locked loop (DLL) 440 comprises phase detector 450, loop filter 460, and current controlled delay line (ICDL) 470. Delay locked loop 440 is used to set the delay of a current controlled delay lines (ICDL) 410A and 410B and ICDL 470 to an accurate fraction of a clock period. Because DLL 440 is operated with a continuous clock (CLK) input signal, no undesired delay drifting occurs once the loop is locked.

The total time delays of ICDL 470, ICDL 410A, and ICDL 410B are determined by the bias currents in those devices. ICDL 470 is a substantially identical replica of ICDL 410A and ICDL 410B. The feed-back loop current in ICDL 470 achieved after the feedback loop is locked is mirrored in ICDL 410A and ICDL 410B. Since the same current flows in all three current controlled delay lines, the time delays of ICDL 470, ICDL 410A, and ICDL 410B are substantially identical.

For example, if each of ICDL 470, ICDL 410A, and ICDL 410B is comprised of N sequential CMOS inverters, the total time delay of each of ICDL 470, ICDL 410A, and ICDL 410B is the sum of the N propagation delays of the N inverters. The time delay of each inverter can be increased by reducing the positive power supply, VDD, and, hence, the bias current, and can be decreased by increasing VDD and the bias current. Therefore, the total time delay of each of ICDL 470, ICDL 410A, and ICDL 410B can be adjusted by increasing and decreasing the bias current.

The CLK signal supplied to one input of phase detector 450 has a highly accurate period equal to the desired time delay of ICDL 410A, ICDL 410B, and ICDL 470. The second input of phase detector 450 is the output of ICDL 470. In one embodiment of the present invention, ICDL 470 is set up as a ring oscillator (e.g., output connected to input) and oscillates at a frequency determined by its total delay, D. If ICDL 470 oscillates too slowly or too quickly compared with the time period of the CLK signal, phase detector 450 detects the difference and generates an error signal that either increments or decrements the control voltage generated by loop filter 460 in order to compensate for the detected phase error.

In an alternate embodiment of the present invention, ICDL 470 is not set up as an oscillator, but the CLK signal is applied to the input of ICDL 470, so that the output of ICDL 470 is a time-delayed copy of the CLK signal. Thus, phase detector 450 compares the CLK signal and a time-delayed version of the CLK signal, where the time delay, D, of ICDL 470 is nominally equal to one time period of the CLK signal. If the delay of ICDL 470 is too short or too long compared with the time period of the CLK signal, phase detector 450 detects the difference and generates an error signal that either increments or decrements the control voltage generated by loop filter 460 in order to compensate for the detected phase error (i.e., time difference.

Loop filter 460 increases or decreases the supply voltage and the supply current of ICDL 470, accordingly. Thus, the total delay, D, of ICDL 470 is increased or decreased until the delay of ICDL 470 is synchronized with the time period of the CLK signal. The current in ICDL 470 is mirrored to ICDL 410A and 410B so that the delays, D, of ICDL 410A and 410B are synchronized with the desired time delay, D, established by the time period of the CLK signal.

Because variations in integrated circuit processing, as well as supply voltage reduction and temperature changes, are slow functions over time, these variations are easily tracked by DLL 440 and corrected via a small change in the current supplied to ICDL 410A and ICDL 410B. The present invention relies on good matching between ICDL 410A, ICDL 410B, and ICDL 460, which is possible down to a fraction of a percent using standard analog layout techniques. Using either analog or digital loop filters, all components of this scheme can be integrated without the need for extra chip pins or external components which increase the cost.

Although the present invention has been described in detail, those skilled in the art should understand that they can make various changes, substitutions and alterations herein without departing from the spirit and scope of the invention in its broadest form.

What is claimed is:

1. A frequency discriminator for detecting phase shifts between sequential pulses in a frequency-shift keyed (FSK) signal having a nominal frequency, said frequency discriminator comprising:
   a peak-to-peak detector capable of receiving said FSK signal and limiting an amplitude of said FSK signal to produce a limited FSK signal;
   a first current controlled delay line capable of receiving said limited FSK signal and delaying said limited FSK signal by a desired time delay to thereby produce a time-delayed limited FSK signal;
   a first multiplier capable of receiving and multiplying said limited FSK signal and said time-delayed limited FSK signal to thereby produce an output product signal proportional to a phase shift between said limited FSK signal and said time-delayed limited FSK signal; and
   a delay locked loop comprising a second current controlled delay line substantially similar to said first current controlled delay line, wherein said delay locked loop receives a reference clock signal having a time period equal to said desired time delay and adjusts a control current level in said second current controlled delay line until a delay of said second current controlled delay line matches said time period of said reference clock signal, wherein said control current level is then used to adjust a delay of said first current controlled delay line.

2. The frequency discriminator as set forth in claim 1 wherein said delay locked loop adjusts said control current level of said second current controlled delay line by adjusting a bias current in said second current controlled delay line.

3. The frequency discriminator as set forth in claim 2 wherein said delay locked loop adjusts said delay of said first current controlled delay line by adjusting a bias current in said first current controlled delay line to match said bias current in said second current controlled delay line.

4. The frequency discriminator as set forth in claim 3 wherein said delay locked loop comprises a phase detector having a first input for receiving said reference clock signal and a second input for receiving an output signal of said second current controlled delay line and generating a correction control signal determined by a phase difference between said reference clock signal and said output signal of said second current controlled delay line.

5. The frequency discriminator as set forth in claim 4 wherein said second current controlled delay line is configured as an oscillator.

6. The frequency discriminator as set forth in claim 2 further comprising:
   a third current controlled delay line capable of receiving said limited FSK signal and delaying said limited FSK signal by a desired time delay to thereby produce a time-delayed limited FSK signal; and
   a second multiplier capable of receiving and multiplying said limited FSK signal and said time-delayed limited FSK signal to thereby produce an output product signal proportional to a phase shift between said limited FSK signal and said time-delayed limited FSK signal;
   wherein said delay locked loop uses said control current level to adjust a delay of said third current controlled delay line.

7. The frequency discriminator as set forth in claim 6 wherein said delay locked loop adjusts said delay of said third current controlled delay line by adjusting a bias current in said third current controlled delay line to match said bias current in said second current controlled delay line.

8. A frequency-shift keyed (FSK) receiver comprising:
   demodulation circuitry capable of receiving an incoming radio frequency (RF) signal and generating therefrom a frequency-shift keyed (FSK) signal having a nominal frequency; and
   a frequency discriminator coupled to said demodulation circuitry for detecting phase shifts between sequential pulses in said FSK signal, said frequency discriminator comprising:
      a peak-to-peak detector capable of receiving said FSK signal and limiting an amplitude of said FSK signal to produce a limited FSK signal;
      a first current controlled delay line capable of receiving said limited FSK signal and delaying said limited FSK signal by a desired time delay to thereby produce a time-delayed limited FSK signal;
      a multiplier capable of receiving and multiplying said limited FSK signal and said time-delayed limited FSK signal to thereby produce an output product signal proportional to a phase shift between said limited FSK signal and said time-delayed limited FSK signal; and
      a delay locked loop comprising a second current controlled delay line substantially similar to said first current controlled delay line, wherein said delay locked loop receives a reference clock signal having a time period equal to said desired time delay and adjusts a control current level in said second current controlled delay line until a delay of said second current controlled delay line matches said time period of said reference clock signal, wherein said control current level is then used to adjust a delay of said first current controlled delay line.

9. The frequency-shift keyed receiver as set forth in claim 8 wherein said delay locked loop adjusts said control current level of said second current controlled delay line by adjusting a bias current in said second current controlled delay line.

10. The frequency-shift keyed receiver as set forth in claim 9 wherein said delay locked loop adjusts said delay of said first current controlled delay line by adjusting a bias current in said first current controlled delay line to match said bias current in said second current controlled delay line.

11. The frequency-shift keyed receiver as set forth in claim 10 wherein said delay locked loop comprises a phase detector having a first input for receiving said reference clock signal and a second input for receiving an output signal of said second current controlled delay line and generating a correction control signal determined by a phase difference between said reference clock signal and said output signal of said second current controlled delay line.

12. The frequency-shift keyed receiver as set forth in claim 11 wherein said second current controlled delay line is configured as an oscillator.

13. The frequency-shift keyed receiver as set forth in claim 9 further comprising:

a third current controlled delay line capable of receiving said limited FSK signal and delaying said limited FSK signal by a desired time delay to thereby produce a time-delayed limited FSK signal; and a second multiplier capable of receiving and multiplying said limited FSK signal and said time-delayed limited FSK signal to thereby produce an output product signal proportional to a phase shift between said limited FSK signal and said time-delayed limited FSK signal;

wherein said delay locked loop uses said control current level to adjust a delay of said third current controlled delay line.

14. The frequency-shift keyed receiver as set forth in claim 13 wherein said delay locked loop adjusts said delay of said third current controlled delay line by adjusting a bias current in said third current controlled delay line to match said bias current in said second current controlled delay line.

15. A method of controlling a frequency discriminator operable to detect phase shifts between sequential pulses in a frequency-shift keyed (FSK) signal having a nominal frequency, the method comprising the steps of:

limiting an amplitude of said FSK signal to produce a limited FSK signal;

in a first current controlled delay line, delaying the limited FSK signal by a desired time delay to thereby produce a time-delayed limited FSK signal;

in a multiplier, multiplying the limited FSK signal and the time-delayed limited FSK signal to thereby produce an output product signal proportional to a phase shift between said limited FSK signal and said time-delayed limited FSK signal;

in a delay locked loop comprising a second current controlled delay line substantially similar to the first current controlled delay line, receiving a reference clock signal having a time period equal to the desired time delay and adjusting a control current level in the second current controlled delay line until a delay of the second current controlled delay line matches the time period of the reference clock signal; and adjusting a delay of the first current controlled delay line according to the control current level.

16. The method as set forth in claim 15 wherein the step of adjusting the control current level of the second current controlled delay line comprises the step of adjusting a bias current in the second current controlled delay line.

17. The method as set forth in claim 16 wherein the step of adjusting the delay of the first current controlled delay line comprises the step of adjusting a bias current in the first current controlled delay line to match the bias current in the second current controlled delay line.

18. The method as set forth in claim 17 wherein the delay locked loop comprises a phase detector having a first input for receiving the reference clock signal and a second input for receiving an output signal of the second current controlled delay line and generating a correction control signal determined by a phase difference between the reference clock signal and the output signal of the second current controlled delay line.

19. The method as set forth in claim 18 wherein the second current controlled delay line is configured as an oscillator.

20. The method as set forth in claim 16 further comprising the steps of:

in a third current controlled delay line, delaying the limited FSK signal by a desired time delay to thereby produce a time-delayed limited FSK signal;

in a second multiplier, multiplying the limited FSK signal and the time-delayed limited FSK signal to thereby produce an output product signal proportional to a phase shift between said limited FSK signal and said time-delayed limited FSK signal; and adjusting a delay of the third current controlled delay line according to the control current level.

21. The method as set forth in claim 20 wherein the step of adjusting the delay of the third current controlled delay line comprises the step of adjusting a bias current in the third current controlled delay line to match the bias current in the second current controlled delay line.

22. The frequency discriminator of claim 1, wherein the limited FSK signal comprises a series of pulses, wherein a pulse width in the limited FSK signal varies according to an amount of frequency change between pulses in the limited FSK signal.

23. The frequency discriminator of claim 1, wherein the limited FSK signal comprises a square wave.

24. The frequency discriminator of claim 1, wherein the first multiplier comprises an XOR gate.

* * * * *